(12) United States Patent
Bai et al.

(10) Patent No.: US 7,763,544 B2
(45) Date of Patent: Jul. 27, 2010

(54) METHOD OF FORMING FINE PATTERN OF SEMICONDUCTOR DEVICE USING SIGE LAYER AS SACRIFICIAL LAYER, AND METHOD OF FORMING SELF-ALIGNED CONTACTS USING THE SAME

(75) Inventors: Keun-Hee Bai, Suwon-si (KR);
Kyeong-Koo Chi, Seoul (KR);
Chang-Jin Kang, Suwon-si (KR);
Cheol-Kyu Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/496,108

(22) Filed: Jul. 1, 2009

(65) Prior Publication Data

US 2009/0263970 A1   Oct. 22, 2009

Related U.S. Application Data

(62) Division of application No. 11/157,435, filed on Jun. 21, 2005, now Pat. No. 7,566,659.

(30) Foreign Application Priority Data

Jun. 22, 2004 (KR) ............................. 2004-46555

(51) Int. Cl.
*H01L 21/302* (2006.01)
(52) U.S. Cl. .................... 438/704; 438/672; 438/675; 257/E21.587

(58) Field of Classification Search ............... 438/669, 438/670, 672, 675, 704, 752, 753; 257/E21.587
See application file for complete search history.

(56) References Cited

U.S. PATENT DOCUMENTS 7,279,419 B2 *  10/2007  Kim et al. ................... 438/668

* cited by examiner

*Primary Examiner*—Thanhha Pham
(74) *Attorney, Agent, or Firm*—F. Chau & Associates, LLC

(57) ABSTRACT

There are provided a method of forming a fine pattern of a semiconductor device using a silicon germanium sacrificial layer, and a method of forming a self-aligned contact using the same. The method of forming a self-aligned contact of a semiconductor device includes forming a conductive line structure having a conductive material layer, a hard mask layer, and a sidewall spacer on a substrate, and forming a silicon germanium ($Si_{1-x}Ge_x$) sacrificial layer, which has a height equal to or higher than a height of at least the conductive line structure, on an entire surface of the substrate. Then, a photoresist pattern for defining a contact hole is formed on the sacrificial layer, and the sacrificial layer is dry-etched, thereby forming a contact hole for exposing the substrate. A plurality of contacts for filling the contact hole are formed using polysilicon, and the remained sacrificial layer is wet-etched. Then, the region where the sacrificial layer is removed is filled with silicon oxide, thereby forming a first interlayer insulating layer.

11 Claims, 8 Drawing Sheets

METHOD OF FORMING FINE PATTERN OF SEMICONDUCTOR DEVICE USING SIGE LAYER AS SACRIFICIAL LAYER, AND METHOD OF FORMING SELF-ALIGNED CONTACTS USING THE SAME

CROSS-REFERENCE TO RELATED APPLICATION

This application is a divisional of application Ser. No. 11/157,435, filed Jun. 21, 2005, now U.S. Pat. No. 7,566,659 which claims the priority under 35 U.S.C. §119 to Korean Patent Application No. 2004-46555, filed on Jun. 22, 2004, in the Korean Intellectual Property Office, the disclosures of which are each incorporated by reference herein in their entireties.

BACKGROUND OF THE INVENTION

1. Field of the Invention

The present invention relates to semiconductor device fabrication. More particularly, the present invention relates to methods of forming a fine pattern of semiconductor devices, and methods of forming self-aligned contact (SAC).

2. Description of the Related Art

As the design requirements for fabricating semiconductor devices decrease, the processes for fabricating semiconductor devices have become increasingly complicated. Particularly, as misalignment margins of the photolithographic process decrease and the etching depth increase, when fine patterns such as a contact pad is formed, it is more difficult to form a fine contact. The SAC formation process is an alternative to producing misalignment margins.

In the SAC formation process, two or more different insulating materials are prepared, and a contact hole is formed using etch selectivity between the insulating materials. As the misalignment margin of the exposure process increases with the SAC formation process, it is easier to form a fine contact. The SAC formation process normally uses silicon oxide and silicon nitride as the different two insulating materials. For example, the SAC pad formation process of the DRAM device uses an etch selectivity between the silicon oxide interlayer insulating layer, and the silicon nitride capping layer, which forms the gate line or the bit line and the sidewall spacer. Thus, the alignment margins can be better achieved using the SAC formation process, despite the fineness of the pattern.

However, with the trend toward a higher integration of semiconductor devices, the aspect ratio of the contact hole becomes significantly increased. With the increase in the aspect ratio, the etch selectivity between the insulating materials used in the SAC formation process is also increased. For example, to perform the SAC formation process stably in a DRAM device, the etch selectivity of the etched material layer (silicon oxide layer) relative to the mask layer (silicon nitride layer) should be above 20 during the dry etching process. However, since an etch selectivity of a silicon oxide layer relative to a silicon nitride layer is generally about 12, the process margin is insufficient.

Significant efforts have been introduced to provide a higher etch selectivity. For example, the wall of the chamber in which the dry etching process is heated, so as to increase a concentration of $CF_x$ radical inside the plasma introduced as etchants. Further, new carbon fluoride based gases having a high C/F ratio, such as $C_4F_8$, $C_5F_8$, $C_3F_6$, or the like, maybe used as etchant. Moreover, new methods for suppressing the generation of excess F radicals due to over-dissociation of etchant inside the plasma by developing a new plasma source having a low electron temperature have been introduced.

However, all the above efforts provide an insufficient etch selectivity of about 10, and a high etch selectivity of above 20 cannot be achieved by the above methods. This is because the dry etching of the silicon oxide layer generates a physical etch, such as sputtering, more actively than a chemical etch, due to the substance properties of the silicon oxide layer. Normally, the high bias power in the range of about 500 to 2000 W is applied in order to etch the silicon oxide layer. As a result, a significant amount of sputtering occurs in the mask layer as well as the silicon oxide layer, by the $C_xF_y$ gas, argon (Ar) gas, and/or oxygen ($O_2$) gas in which a high bias power is applied. As a result, the capping layer and a sidewall spacer as etch masks are damaged, so that it is difficult to achieve a high etch selectivity above the required value of 20.

Besides, the photoresist layer may be deformed due to the strong sputtering effect. Since the thickness of the photoresist layer is decreased with the decrease in design requirements for fabricating semiconductor devices, the deformation of the photoresist layer due to the strong sputtering effect becomes more of a problem in semiconductor device fabrication. If the photoresist layer is deformed significantly, wiggling, striation, or the like may occur.

In order to solve the problem of photoresist deformation, a method of forming a polysilicon layer as an etch mask pattern has been introduced. However, that method is costly since the polysilicon layer is removed using a CMP or the like. Other problems also include high thermal budget and complicated formation processes. Further, the above method has limits in solving the problem of generating strong sputtering effects because it requires a high bias power to form the silicon oxide layer as the interlayer insulating layer, and it has a low etch selectivity relative to a hard mask layer due to its strong sputtering effect.

SUMMARY OF THE INVENTION

The present invention provides a method of forming fine patterns of semiconductor devices and methods of forming a self-aligned contact using the method of forming fine patterns of semiconductor devices. Such methods are capable of forming fine patterns of the semiconductor device easily and economically, even though an aspect ratio is increased with the decrease in design requirement for fabricating semiconductor devices.

Further, the present invention provides a method of forming fine patterns of semiconductor devices and a method of forming a self-aligned contact using the method of forming fine patterns of semiconductor devices. Such methods are proceeded without deforming photoresist layers having the same thickness as that of the conventional photoresist layers, even though the photoresist layer are decreased in thickness with the decrease in design requirement for fabricating semiconductor devices.

According to an aspect of the present invention, there is provided methods of forming fine patterns of semiconductor devices, which include forming silicon germanium ($Si_{1-x}Ge_x$) as the sacrificial layer on a substrate. The sacrificial layer may be formed on the semiconductor substrate, or the material layer may be further interposed between the semiconductor substrate and the sacrificial layer. The photoresist pattern having a predetermined pattern is formed on the sacrificial layer. The sacrificial layer is dry-etched using the photoresist pattern as the etch mask, thereby forming the sacrificial layer pattern for exposing the substrate. A first material layer pattern is formed for filling a region defined by the sacrificial layer pattern, using a first material having a great etch selectivity relative to the silicon germanium. The sacrificial layer pattern is removed by wet-etching, and the region where the removed sacrificial layer pattern is located is filled with a second material, thereby forming a second material layer pattern.

In accordance with an exemplary embodiment of the present invention, the first material may be a conductive material, and the second material may be an insulating material. Alternatively, the first material may be an insulating material, and the second material may be a conductive material. In this case, the conductive material may be polysilicon, metal silicide, or metal, but is preferably polysilicon. The insulating material may be silicon oxide, silicon nitride, or silicon oxynitride, but is preferably silicon oxide.

Further, a bias power applied in a dry etching chamber during the dry etching process of the sacrificial layer may be from about 30 to about 300 W. Further, in the wet etchant used to remove the sacrificial layer pattern, an etch selectivity of the sacrificial layer pattern relative to the first material layer may be equal to or higher than about 30:1. Alternatively, the wet etchant used to remove the sacrificial layer pattern may have an etch rate of about several hundred Å per minute. For example, the wet etching process for removing the sacrificial layer pattern may use wet etchant of a mixture including ammonium hydroxide ($NH_4OH$), hydrogen peroxide ($H_2O_2$), and deionized water ($H_2O$). Here, a mixing ratio of ammonium hydroxide, hydrogen peroxide, and deionized water may be about 1:4:20. The mixture is preferably used by heating up to a temperature of from about 40 to about 75° C. The mixture may further include peracetic acid (PAA), acetic acid ($CH_3COOH$), fluoric acid (HF) and/or surfactant.

In accordance with another exemplary embodiment of the present invention, the range of the x of the silicon germanium used to form the sacrificial layer may be from about 0.1 to about 0.8. Further, the process temperature in the operation of forming the silicon germanium sacrificial layer may be from about 350 to about 500° C.

The methods of forming a fine pattern according to the present invention can be employed on embodiments of forming a contact of a semiconductor device.

According to another aspect of the present invention, there is provided a method of forming a contact of a semiconductor device. In this method, silicon germanium ($Si_{1-x}Ge_x$) is formed as a sacrificial layer on a material layer having a plurality of first conductive patterns. A photoresist pattern having a predetermined pattern is formed on the sacrificial layer. The sacrificial layer is dry-etched using the photoresist pattern as an etch mask, thereby forming a plurality of openings for exposing each of the plurality of first conductive patterns. A plurality of second conductive patterns are formed for filling the plurality of openings, using polysilicon. The remaining sacrificial layer is removed by wet-etching, and the region where the removed sacrificial layer is located is filled with silicon oxide, thereby forming a first interlayer insulating layer.

Another exemplary embodiment of the present invention provides a method of forming a contact of a semiconductor device, wherein a silicon germanium ($Si_{1-x}Ge_x$) is formed as a sacrificial layer on a material layer having a plurality of first conductive patterns. A photoresist pattern having a predetermined pattern is formed on the sacrificial layer. The sacrificial layer is dry-etched using the photoresist pattern as an etch mask, thereby forming a plurality of sacrificial layer patterns for covering each of the plurality of first conductive patterns. A first interlayer insulating layer surrounding the plurality of sacrificial layer patterns is formed using silicon oxide. The plurality of sacrificial layer patterns is removed by wet-etching, and the region where the removed sacrificial layer is located is filled with polysilicon, thereby forming a second conductive pattern.

The method of forming a fine pattern according to the present invention can be employed to form a self-aligned contact of a semiconductor device.

According to a still another aspect of the present invention, there is provided a method of forming a self-aligned contact of a semiconductor device. In the method, a conductive line structure, which includes a conductive material layer, a hard mask layer, and a sidewall spacer, is formed on a substrate. A silicon germanium ($Si_{1-x}Ge_x$) sacrificial layer, which has a height equal to or higher than the height of at least the conductive line structure, is formed on an entire surface of the substrate. A photoresist pattern for defining the contact hole is formed on the sacrificial layer. The sacrificial layer is dry-etched using the photoresist pattern as an etch mask, thereby forming the contact hole for exposing the substrate. A plurality of contacts for filling the contact hole are formed using polysilicon. The remaining sacrificial layer is removed by wet-etching, and the region where the removed sacrificial layer is located is filled with silicon oxide, thereby forming a first interlayer insulating layer.

Another exemplary embodiment of the present disclosure provides a method of forming a self-aligned contact of a semiconductor device, in which a conductive line structure, including a conductive material layer, a hard mask layer, and a sidewall spacer, is formed on a substrate. A silicon germanium ($Si_{1-x}Ge_x$) sacrificial layer, which has a height equal to or higher than the height of at least the conductive line structure, is formed on the entire surface of the substrate. A photoresist pattern, which corresponds to a contact to be formed in a subsequent process, is formed on the sacrificial layer. The sacrificial layer is dry-etched using the photoresist pattern as an etch mask, thereby forming a sacrificial layer pattern corresponding to the contact pattern. The first interlayer insulating layer surrounding the sacrificial layer pattern is formed using silicon oxide. The plurality of sacrificial layer patterns are removed by wet-etching, and the region where the removed sacrificial layer is located is filled with polysilicon, thereby forming the contact.

In the method of forming a self-aligned contact according to the embodiments as described above, the conductive line structure may be a gate line structure, which further includes a gate oxide layer formed under the conductive material layer. The contact is electrically connected to source/drain regions of the substrate. Alternatively, the conductive line structure may be a bit line structure. The hard mask layer and the sidewall spacer may be composed of silicon nitride, and the sidewall spacer may be composed of silicon oxide.

BRIEF DESCRIPTION OF THE DRAWINGS

The above and other features of the present invention will become more apparent by describing in detail exemplary embodiments thereof with reference to the attached drawings in which:

FIGS. 6A through 8C are schematic views illustrating a method of forming a self-aligned contact of a semiconductor device in accordance with processing sequences according to an embodiment of the present invention, in which FIGS. 6A, 7A, and 8A are plan views;

FIGS. 6C, 7C, and 8C are sectional views taken along lines of YY' of FIGS. 6A, 7A, and 8A, respectively.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

A silicon germanium ($Si_{1-x}Ge_x$) layer is used as the sacrificial layer in both methods of forming fine patterns of a semiconductor device and methods of forming self-aligned contacts. The silicon germanium ($Si_{1-x}Ge_x$) layer can be patterned by a dry etch, in which it provides good chemical etch characteristics in the material of interest. The dry etching process can be performed by applying a bias power as low as from about 30 to about 300 W into an etching chamber. Since a relatively low bias power is applied to the etchant gas used for the dry etching process, there is little possibility that any sputtering reaction on the substrate's material layer, for example, a photoresist pattern and a peripheral material layer, will occur. Further, since the silicon germanium ($Si_{1-x}Ge_x$) layer can be easily removed by a wet etching, it is appropriate to be used as a sacrificial layer.

FIGS. 1 through 5 are sectional views illustrating a method of forming a fine pattern of a semiconductor device according to a first embodiment of the present invention.

Figure 1:
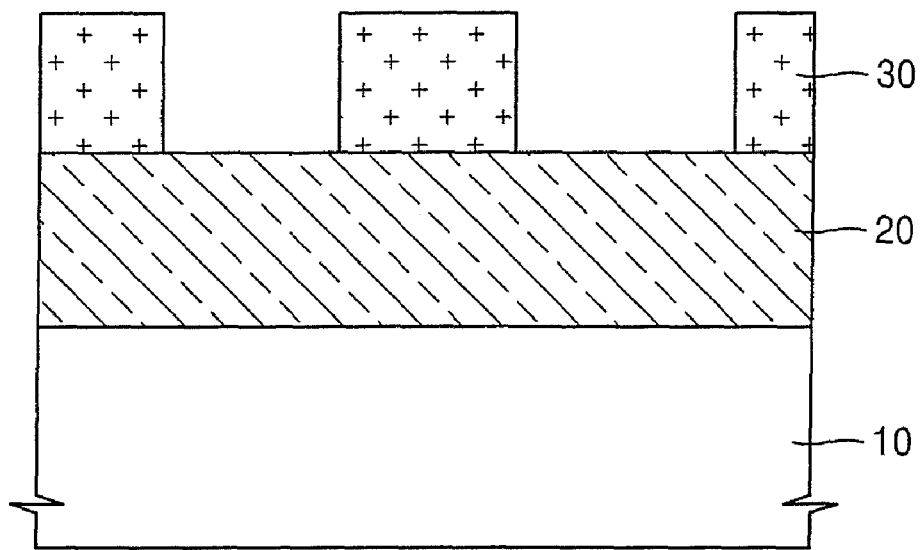
FIGS. 1 through 5 are sectional views illustrating a method of forming a fine pattern of a semiconductor device in accordance with processing sequences according to an embodiment of the present invention.

Referring to FIG. 1, a silicon germanium ($Si_{1-x}Ge_x$) layer 20 to be used as the sacrificial layer is formed on a substrate 10. Then, a photoresist pattern 30 is formed on the sacrificial layer 20 to pattern the sacrificial layer 20.

The substrate 10 may be a semiconductor substrate such as a silicon substrate, or an insulating layer such as a silicon oxide layer having a conductive pattern embedded therein, or a conductive layer such as doped polysilicon.

The silicon germanium sacrificial layer 20 may be formed by an LPCVD method using equipment of a furnace type, a sheet type or a mini batch type loading 25 pieces of wafers. This case is advantageous for reducing thermal budget since a low temperature process, that is, a process temperature of from about 350 to about 500° C., is possible. The thickness of the silicon germanium sacrificial layer 20 is determined by the height of the fine pattern to be formed.

A source gas used in the formation of the silicon germanium sacrificial layer 20 includes silane based gas such as $SiH_4$, $Si_2H_6$ and/or $SiH_2Cl_2$, etc. and a gas such as $GeH_4$ and/or $GeF_4$, etc. The amount of Ge in the silicon germanium sacrificial layer ($Si_{1-x}Ge_x$) 20, that is, the range of x can be determined by controlling the flow ratio of the source gas that supplies Ge. The mixing ratio is not specifically limited. However, the range of x should be determined on the basis of the etch selectivity relative to the substrate 10, which is exposed when patterning the sacrificial layer 20, and also provides an etch selectivity relative to the fine pattern when removing the sacrificial layer 20 after forming the desired fine pattern. For example, the range of x is from about 0.1 to about 0.8. In order to control the range of x very finely, $GeH_4$ as a Ge source gas is supplied after dilution by hydrogen or nitrogen, etc.

A photoresist pattern 30 is formed by depositing a photosensitive resist for KrF, or a photosensitive resist for ArF such as COMA or acrylade, exposing it using an exposure light source, and developing it. In order to prevent scatter reflection during an exposing process, and enhance an adhesive force of the photosensitive resist, an organic or inorganic based anti-reflection coating (ARC) can be used.

There is no specific limit in the region defined by the photoresist pattern 30. For example, if a contact is formed inside an interlayer insulating layer on the substrate 10, then the region defined by the photoresist pattern 30 may be a region where a contact will be formed, or a region where an interlayer insulating layer surrounding the contact will be formed. Further, there is no specific limitation for the pattern of the region defined by the photoresist pattern 30. For example, the region defined by the photoresist pattern 30 may be a contact type pattern or a line type pattern, or the photoresist pattern 30, itself, may be a contact type pattern.

Figure 2:
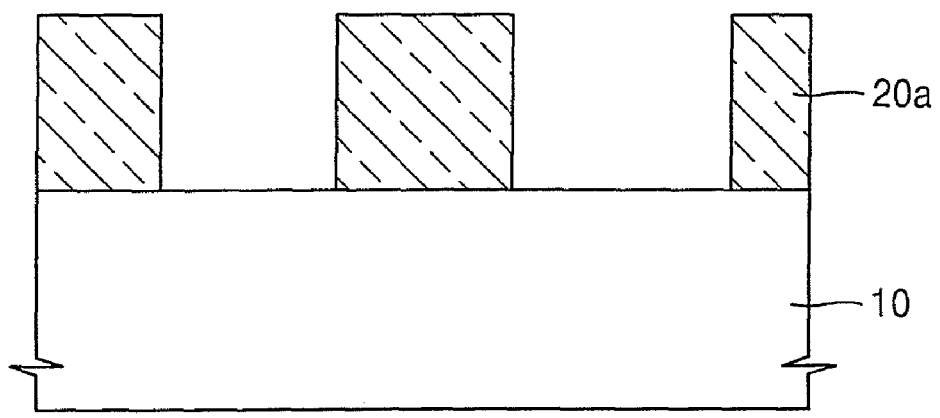

Referring to FIG. 2, the silicon germanium sacrificial layer 20 is dry-etched using the photoresist pattern 30 as an etch mask, thereby forming a sacrificial layer pattern 20a. The dry etching of the sacrificial layer 20 can be performed using a mixture of HBr and $O_2$, a mixture of $Cl_2$, $O_2$, and HBr, or a mixture of Ar and/or $C_xF_y$ gas added to one of the above mixtures, or a mixture of HBr, $HeO_2$, $N_2$, and $C_xF_y$. Further, plasma can be used to improve the etch profile and to shorten process time.

In the dry etching of the sacrificial layer 20, a bias power of from about 30 to about 300 W is applied into an etching chamber. Unlike a silicon oxide layer, since the silicon germanium sacrificial layer actively reacts with an etch gas in a chemical etch due to its physical and chemical characteristics, it is not necessary to apply the same high bias power as when etching the silicon oxide layer.

Figure 3:
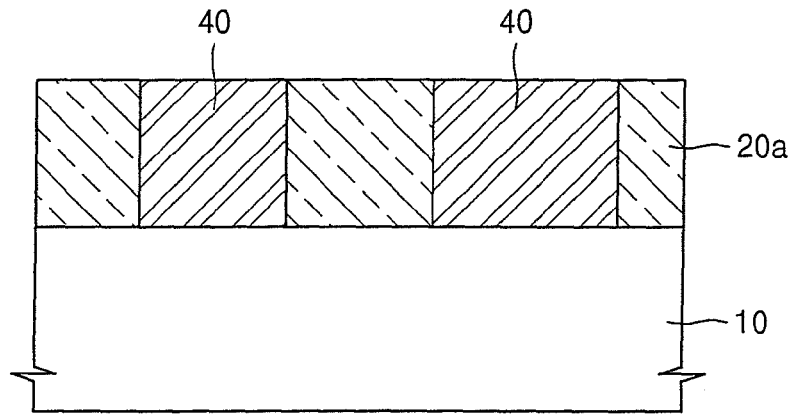

Referring to FIG. 3, a first material layer pattern 40 is formed in a region defined by a sacrificial layer pattern 20a using a first material layer. The first material layer pattern 40 can be formed for the deposition process of the first material layer, the planarization process of CMP, or the like. The first material may include impurity-doped polysilicon, a conductive material such as metal silicide or metal, or an insulating material such as silicon oxide, silicon nitride, or silicon oxynitride. For example, when forming a contact inside an interlayer insulating layer using an impurity-doped polysilicon, the first material may be impurity-doped polysilicon, or silicon oxide used as an interlayer insulating layer material.

Figure 4:
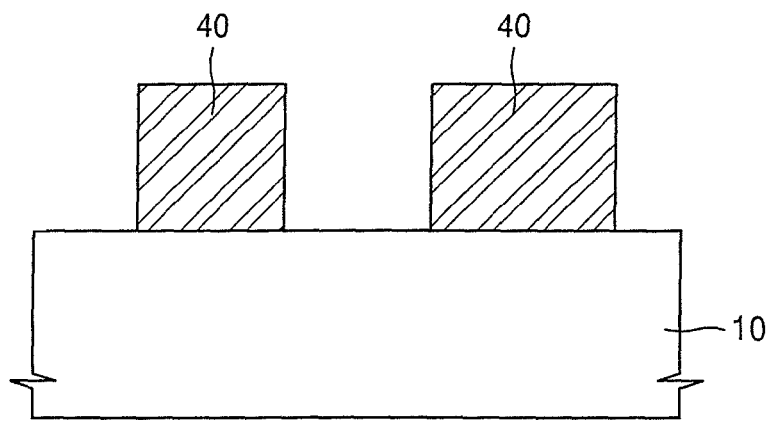

Referring to FIG. 4, the silicon germanium layer pattern 20a is removed by wet etching. The silicon germanium layer pattern 20a is removed with high etch selectivity relative to the first material layer pattern 40. If the first material layer pattern 40 is composed of polysilicon or silicon oxide, it is preferable to use wet etchant, in which the etch ratio of the silicon germanium layer pattern 20a to the first material layer 40 is about 30:1, or higher. Further, process time can be shortened using wet etchant that shows an etching rate of several hundred Å per minute. The etchant for satisfying the above conditions preferably includes a mixture of ammonium hydroxide ($NH_4OH$), hydrogen peroxide ($H_2O_2$), and deionized water ($H_2O$). The mixture may further include peracetic acid, acetic acid, fluoric acid and/or surfactant. For example, the standard cleaning solution (SC-1), in which a mixing ratio of ammonium hydroxide, hydrogen peroxide, and deionized water is about 1:5:1, or a mixing ratio thereof may be about 1:5:20. If the mixture is heated up to a temperature of from about 40 to about 75° C., the removal efficiency of the silicon germanium layer is improved.

A process of etching the silicon germanium layer pattern 20a using a mixture of ammonia, hydrogen peroxide, and deionized water first includes forming of a surface oxide layer by hydrogen peroxide. Hydrogen peroxide is converted into $H_2O$ and O, thereby providing a strong oxidizing power, for rapidly oxidizing Si and Ge.

Ammonia is dissociated into $NH_4^+$ ion and $OH^-$ ion inside deionized water. The $OH^-$ ion separates Si oxide and Ge oxide of the silicon germanium layer pattern 20a from the surface of the silicon germanium layer pattern 20a. This is a second step of the lift-off by the $OH^-$ ion. In order to prevent the separated Si oxide and Ge oxide from reattaching on the silicon germanium layer pattern 20a, the $OH^-$ ion is adsorbed on the surface to provide an electrostatic repulsive force the a third step, which is a termination by the $OH^-$ ion.

Since hydrogen peroxide is acidic, the pH is controlled by the mixing ratio with ammonium hydroxide. In accordance with the mixing ratio of hydrogen peroxide, that is, a change of pH, the etch amounts of Si and Ge are varied. Thus, the mixing ratio will be determined such that the etching is performed with an appropriate etch rate while preventing silicon pitting. Normally, higher pH corresponds to an increase in etch rate. Additionally, in the case of a high temperature of about 70° C., since a vaporizing speed of $NH_3$ vapor is increased, it is necessary to supply more ammonia.

In the first step of oxidation, Ge is oxidized faster than Si, and thus, etched at a faster rate. However, if Ge in the silicon germanium layer, which includes Ge and Si, is etched faster, then the remaining Si—Ge layer will be unstable, and thus, Si becomes vulnerable to etchant. Therefore, the etch rate of the silicon germanium layer pattern 20a becomes higher than the etch rate of the material layer composed of a single Si material.

Figure 5:
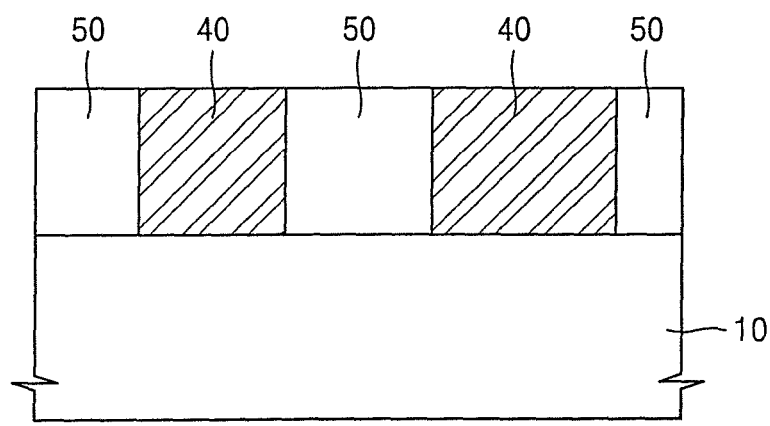

Referring to FIG. 5, a second material layer pattern 50 is formed in a region from which the silicon germanium layer pattern 20a is removed, using a second material. The second material layer pattern 50 can be formed by depositing a second material layer, and then dry etching, or a planarization process such as CMP, or the like. The second material is different from the first material. For example, the second material may be impurity-doped polysilicon, a conductive material such as metal silicide or metal, or an insulating material such as silicon oxide, silicon nitride, or silicon oxynitride. As described above, when forming a contact inside an interlayer insulating layer using the impurity-doped polysilicon, if the first material is impurity-doped polysilicon or silicon oxide for use as an interlayer insulating layer, then the second material may be silicon oxide or impurity-doped polysilicon.

As described above in the embodiment of the present invention, the silicon germanium layer pattern 20a can be removed through a wet etching process using an etchant having an appropriate mixing ratio. In this case, the first material layer pattern 40 or an under-layer has not been significantly damaged. Therefore, the silicon germanium layer is appropriately used as a sacrificial layer for forming a fine pattern to simplify the process and shorten the process time.

Figure 6A:
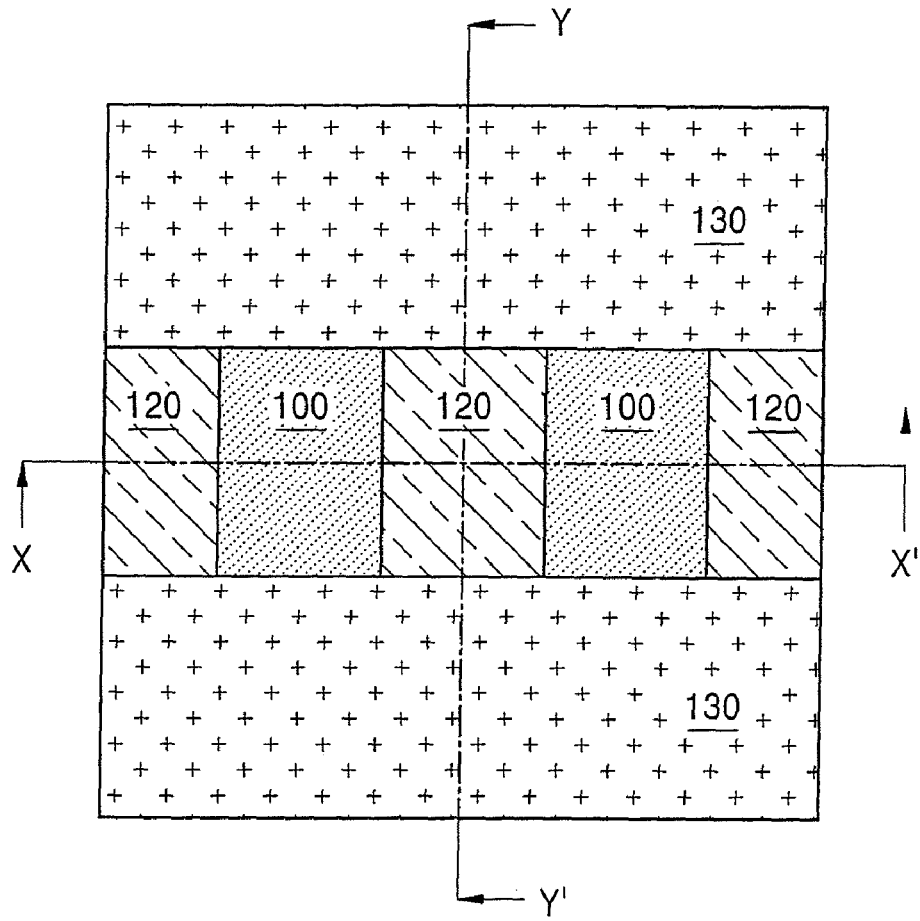
Figure 6B:
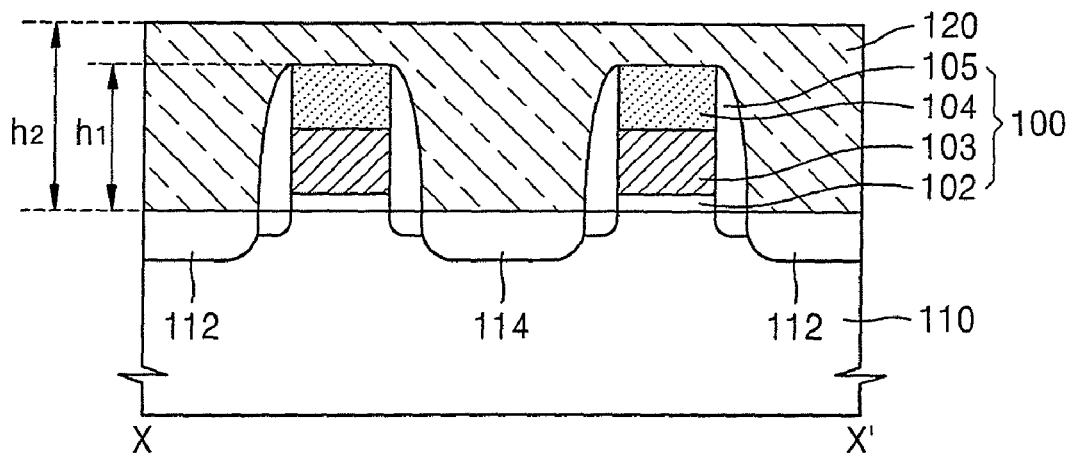
FIGS. 6B, 7B, and 8B are sectional views taken along lines of XX' of FIGS. 6A, 7A, and 8A respectively.
Figure 6C:
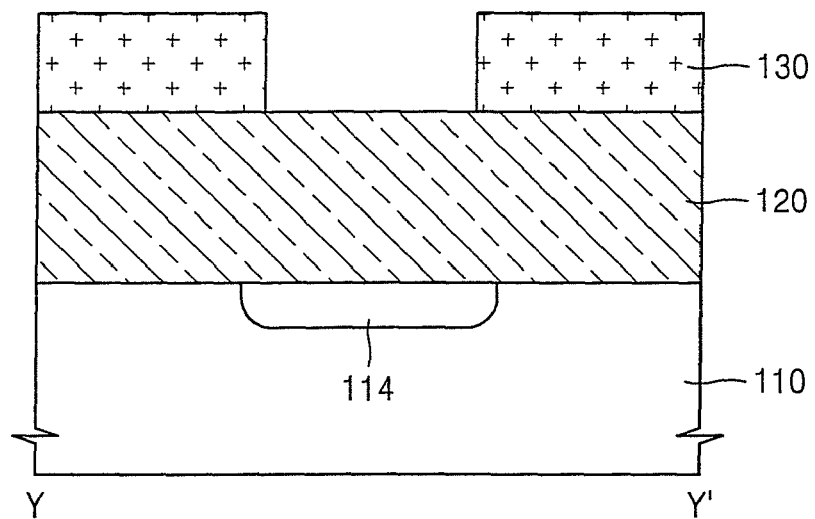
Figure 7A:
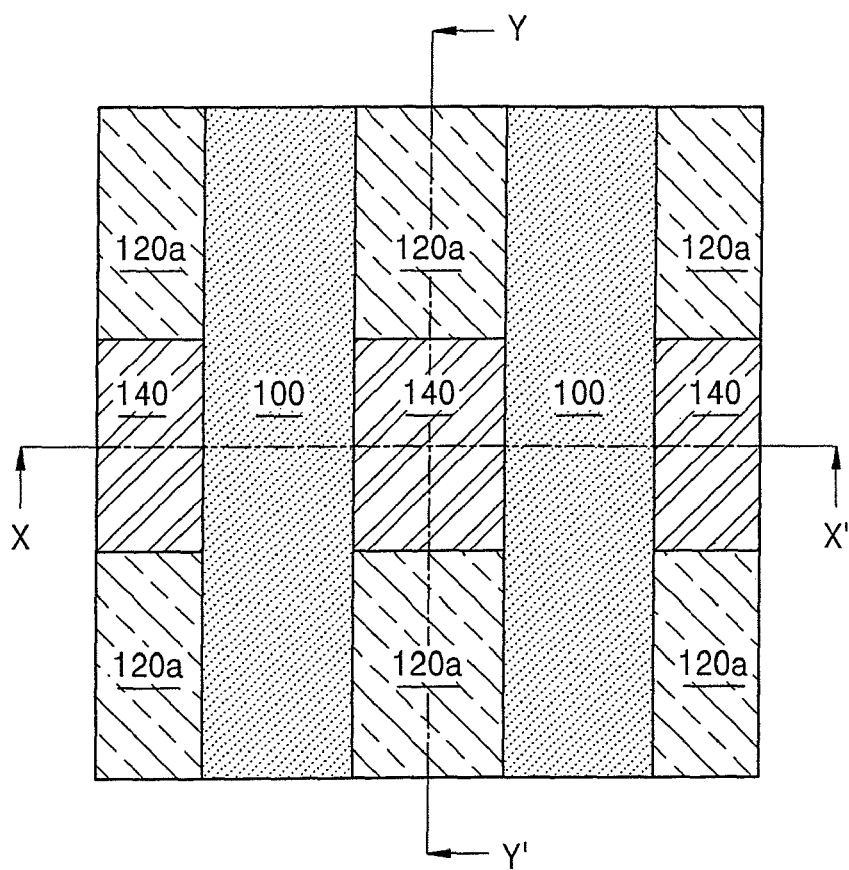
Figure 7B:
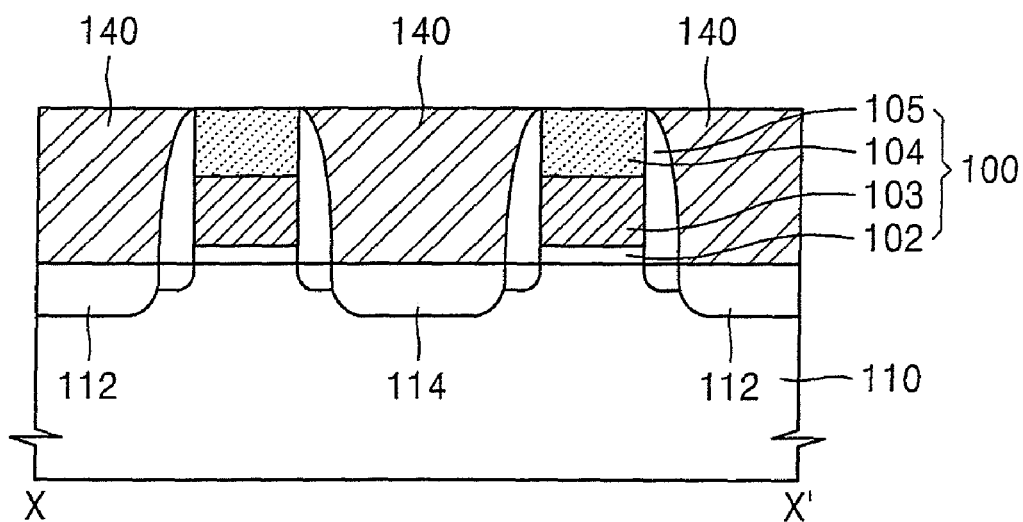
Figure 7C:
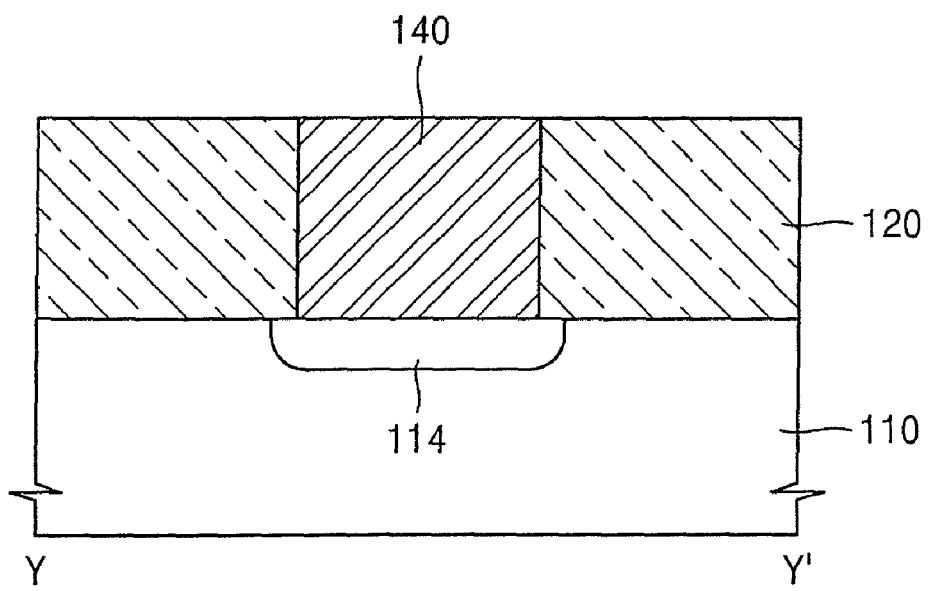
Figure 8A:
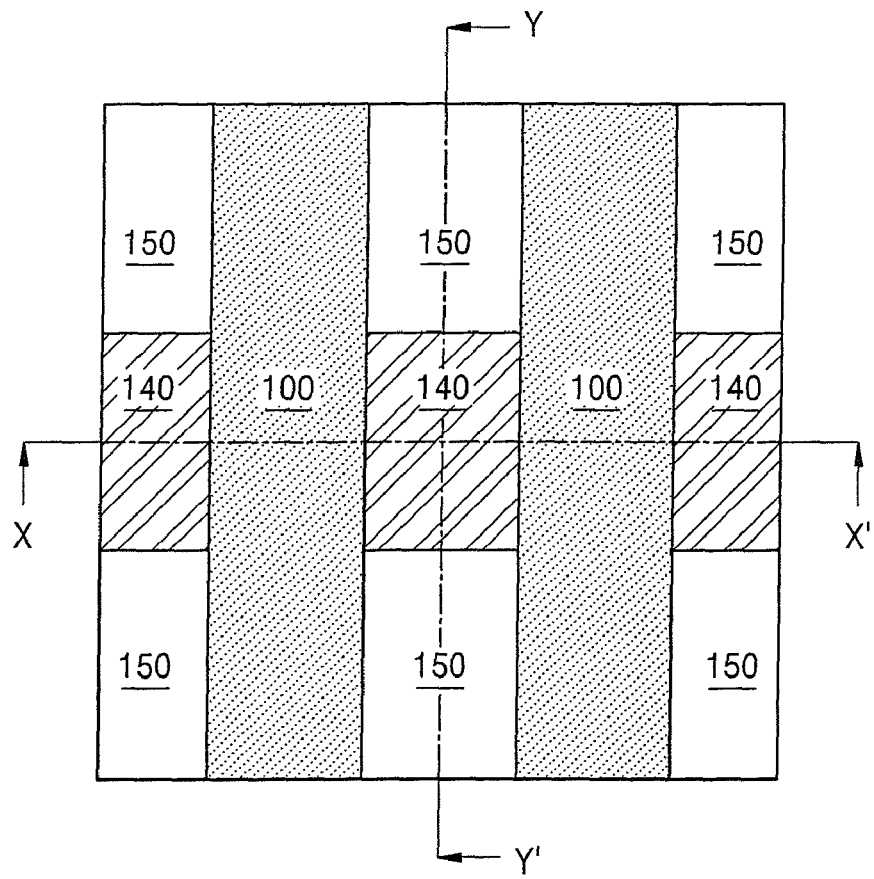
Figure 8B:
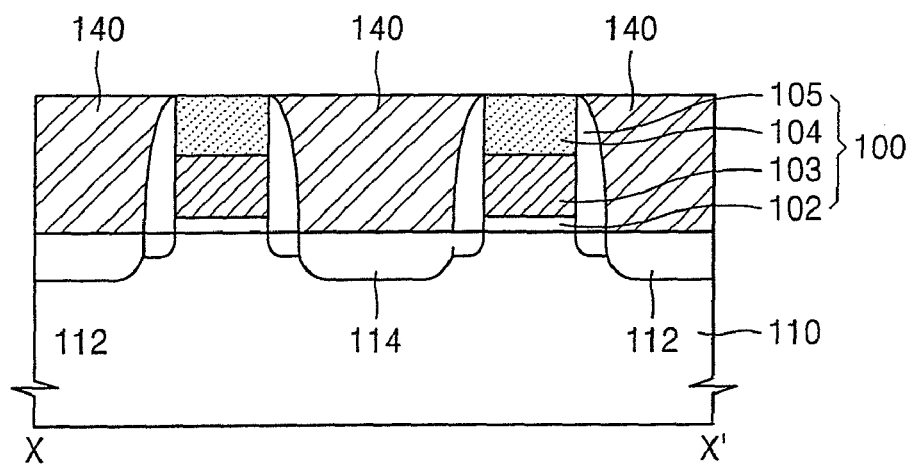
Figure 8C:
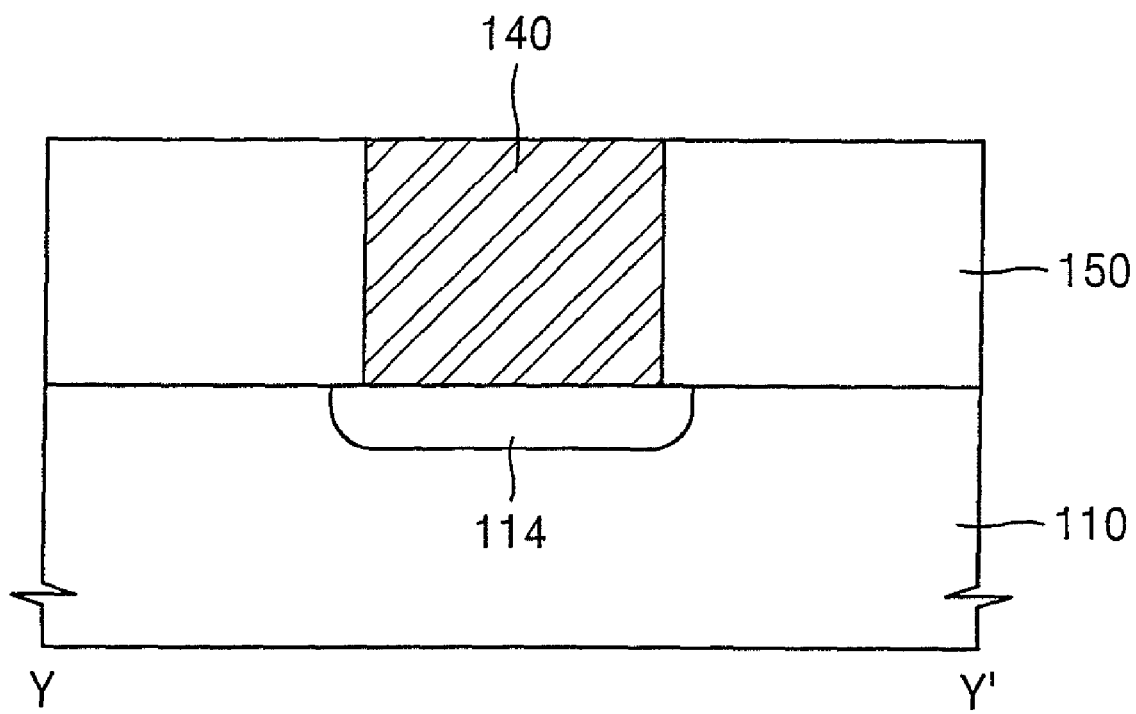

FIGS. 6A through 8C are schematic views illustrating a method of forming a self-aligned contact of a semiconductor device in accordance with processing sequences according to an embodiment of the present invention. As provided herein, FIGS. 6A, 7A, and 8A are plan views, FIGS. 6B, 7B, and 8B are sectional views taken along lines of XX' of FIGS. 6A, 7A, and 8A respectively, and FIGS. 6C, 7C, and 8C are sectional views taken along lines of YY' of FIGS. 6A, 7A, and 8A respectively.

Referring to FIGS. 6A, 6B, and 6C, first, a MOS transistor fabrication process is performed on a semiconductor substrate 110. The MOS transistor is fabricated by a typical fabrication method. Particularly, referring to FIG. 6B, a gate line structure 100 is formed on the semiconductor substrate 110, and source/drain regions 112, 114 are formed in the substrate 110. The gate line structure 100 includes a gate oxide layer 102, a gate conductive layer 103, a hard mask layer 104, and a spacer 105 formed on sidewalls of the gate oxide layer 102, the gate conductive layer 103 and the hard mask layer 104. The gate oxide layer 102 is formed using a thermal oxidation process. Further, the gate conductive layer 103 may be a single layer of an impurity-doped polysilicon layer, a metal silicide layer, or a metal layer, or a mixture layer thereof.

The hard mask layer 104 functions as a mask for preventing the gate conductive layer 103 from being etched during the dry etching process of forming a contact hole in a subsequent SAC process. Therefore, it is preferable to use a material having a high etch selectivity relative to silicon germanium used as the sacrificial layer. For example, the hard mask layer 104 can be composed of an insulating material such as silicon oxide or silicon nitride. Further, the hard mask 104 also functions as an etching stop point in the CMP process. Considering its two functions, the hard mask layer 104 is preferably composed of silicon nitride.

The spacer 105 also functions as a mask during the dry etching process of forming a contact hole of a subsequent SAC process. Therefore, the spacer 105 may be composed of silicon oxide or silicon nitride. Since the silicon oxide is a material having a lower dielectric constant than that of the silicon nitride, the formation of the spacer 105 of silicon oxide provides an advantage of improving electric characteristics of a device. However, the spacer 105 comprising silicon oxide may be disadvantageous because the etch selectivity of the silicon germanium layer comprising the silicon oxide layer is smaller than that of the silicon nitride layer.

Source/drain regions 112, 114 are formed by using the technology known in the art. For example, the source/drain regions 112, 114 are formed with an LDD structure. If the semiconductor substrate 110 is a p-type substrate, the source/drain regions 112, 114 are formed by implanting Group V elements such as arsenic (As).

Subsequently, referring to FIGS. 6A, 6B, and 6C, a silicon germanium sacrificial layer 120 is formed on a resultant structure having the gate line structure 100, with a predetermined thickness. The process of forming the silicon germanium sacrificial layer 120 has been explained in detail in the first embodiment as above, and herein, the description is omitted.

In the embodiment, the height ($h_1$) of the silicon germanium sacrificial layer 120 is equal to, or preferably, slightly higher than the height ($h_2$) of the gate line structure. This is because the silicon germanium sacrificial layer 120 can be easily etched without damage to the surface of a contact in a subsequent process, such as CMP for separating the contact node since the silicon germanium layer 120 is used as a sacrificial layer. Alternatively, separating contact node using an interlayer insulating layer composed of silicon oxide by a conventional technology, may damage the contact because of over-etching of polysilicon, since the polysilicon oxide layer has a relatively hard surface. Conventionally, the SAC process has been performed wherein the height of the interlayer insulating layer is substantially the same as the height of a gate line structure in order to prevent such over-etching. In this case, over-etching may occur in a planarization process of the interlayer insulating layer, thereby resulting in an unnecessary etch of the hard mask layer 104. However, over-etching of the hard mask layer 104 may be prevented if the silicon germanium sacrificial layer 120 is formed to a height ($h_1$) higher than the height ($h_2$) of the gate line structure.

Subsequently, referring to FIGS. 6A, 6B and 6C, a photoresist pattern 130 is formed on the silicon germanium sacrificial layer 120. The photoresist pattern 130 may use the same pattern as the photoresist pattern used in the conventional SAC process as shown in the drawing. That is, the photoresist pattern 130 may be a line-type pattern exposing regions where contact holes are formed and the gate line structure 100 is located between the exposing regions. Alternatively, the photoresist pattern 130 may have a shape totally different from that shown in the drawing. For example, it may be a pattern covering regions where contact holes are formed and the gate line structure 100 between the photoresist pattern 130, that is, a pattern covering regions where an interlayer insulating layer 150 (FIG. 8A) is formed in the final structure, and a gate line structure between them. Hereinafter, only the former case will be explained in detail. The latter case will be apparent to those skilled in the art in reference to the description of the former case.

Referring to FIGS. 7A, 7B, and 7C, a dry etching process is performed using the photoresist pattern 130 as an etch mask. Since specific process conditions of the dry etching process are the same as the first embodiment described as above, a detailed explanation will be omitted here. According to an embodiment of the present invention, the etch gas used in the dry etching process actively reacts in the etching process via a chemical reaction by applying from about 30 to about 300 W of low bias power. The etch selectivity of the silicon germanium is higher relative to silicon oxide and silicon nitride. Therefore, photoresist deformation may be prevented since damage of the photoresist pattern 130 is less than that of the conventional case. Further, according to the embodiment, since the thickness of the photoresist layer is lower than that of the conventional case, it is more appropriate to fabricate a highly-integrated semiconductor device. Further, according to the embodiment, since the hard mask layer 104 and the spacer 105 are slightly etched, the SAC process may prevent contact and lead to short gate lines.

As a result of the dry etching process, the contact hole, which is defined by the silicon germanium sacrificial layer pattern 120a, is formed. The photoresist pattern 130 is removed by ashing and stripping.

Then, the contact hole is filled with a conductive material, that is, impurity-doped polysilicon, thereby forming contact 140. A formation process of the contact 140 is explained as follows. In an embodiment of the present invention, the polysilicon layer is made thick to separate the node of contact 140, and the upper surface of the hard mask layer 104 serves as a planarization point in the node separation process. As described above, since the silicon germanium sacrificial layer 120 is etched more than the silicon oxide layer, the upper surface of the contact 140 is little damaged by scratch, dent, or the like.

Referring to FIGS. 8A, 8B, and 8C, the sacrificial layer pattern 120a is removed using the same wet etching method as described in the first embodiment described above. Further, by depositing silicon oxide in a region where the sacrificial layer pattern 120a is disposed, thereby forming an interlayer insulating layer 150, a self-aligned contact 140, which is structured in the same shape as the conventional one, is formed inside the interlayer insulating layer 150.

Up to now, a method of forming a self-aligned contact between a gate line structure has been provided. It should also be apparent to those skilled in the art that the formation method of a self-aligned contact can be employed by the method of forming a contact between a bit line structure. Therefore, a detailed explanation on an exemplary embodiment of a bit line structure is omitted.

Through following exemplary experiments, the present invention will be described in more detail, and even though not described here in specification, it will be apparently understood to those skilled in the art, and the description thereof is omitted. Further, the following exemplary experiments do not limit the scope of the present invention.

First, an experiment was made on wet etching characteristics to verify the ease of removing the silicon germanium sacrificial layer pattern ($Si_{1-x}Ge_x$) 20a, 120a. The wet etching experiment was performed with following cases: 1) 25° C., 200:1 HF diluted solution, 240 sec. 2) 145° C. sulfuric acid stripping 10 min. 3) 65° C. EKC 20 min. 4) low temperature (50° C.) ammonium hydroxide, hydrogen peroxide, and deionized water (1:4:20) 2 min. 5) high temperature (70° C.) ammonium hydroxide, hydrogen peroxide, and deionized water (1:4:20) 2 min.

1) 50 volume % of HF is mixed with deionized water. 2) sulfuric acid stripping uses a mixture of sulfuric acid ($H_2SO_4$) and hydrogen peroxide ($H_2O_2$) by 1:3 to 1:6. 3) EKC solution is an organic stripper from EKC Technology Inc., and includes solvent and amine. 4),5) 28 to 30 volume % of ammonium hydroxide, and 30 to 32 volume % of hydrogen peroxide are used.

TABLE 1

| flow ratio of $SiH_4$ to 10% $GeH_4$ (480° C.) | 2.6 | 3.1 | 3.6 | 4 |
|---|---|---|---|---|
| 1 | 7 Å | 6 Å | 6 Å | 6 Å |
| 2 | 1 Å | 2 Å | 27 Å | 30 Å |
| 3 | 32 Å | 17 Å | 16 Å | 3 Å |
| 4 | ~300 Å | ~380 Å | ~540 Å | ~700 Å |

In Table 1 and Table 2, etch amounts are shown in the case of 480° C. and 500° C. of $Si_{1-x}Ge_x$ layer deposition temperature by the order that flow ratio of $SiH_4$ to 10% $GeH_4$ is increased.

TABLE 2

| flow ratio of $SiH_4$ to 10% $GeH_4$ (500° C.) | 2.6 | 3.1 | 3.6 | 4 |
|---|---|---|---|---|
| 5 | 257 Å | 499 Å | 836 Å | 987 Å |

In the case of 4) and 5), the etch rates show several hundred Å per minute. Therefore, these experiments confirm the ease of removing the silicon germanium layer after it is used as a sacrificial layer, with a use of a mixing solution of sulfuric acid, hydrogen peroxide, and deionized water.

As shown in Table 1 and Table 2, with an amount of Ge increased, the etch rate is increased as shown in 4) and 5). An etch rate is significantly improved in 5). In the same conditions, an etch rate in the case of etching a silicon oxide layer, a silicon nitride layer, and a polysilicon layer is about 5~10 Å/min.

Then, an experiment was made on the dry etching characteristics of a silicon germanium layer. In the experiment, an etchant as dry etching gas uses a mixture of about 200:7 of HBr and $O_2$. The bias power is from about 150 to about 500 W.

The structure to be etched is a silicon germanium layer as a sacrificial layer, which is formed on a gate electrode structure including silicon nitride of a hard mask layer and spacers, with a thickness of about 6000 Å. The experiment result is shown in an SEM image of FIG. 9A.

Figure 9A:
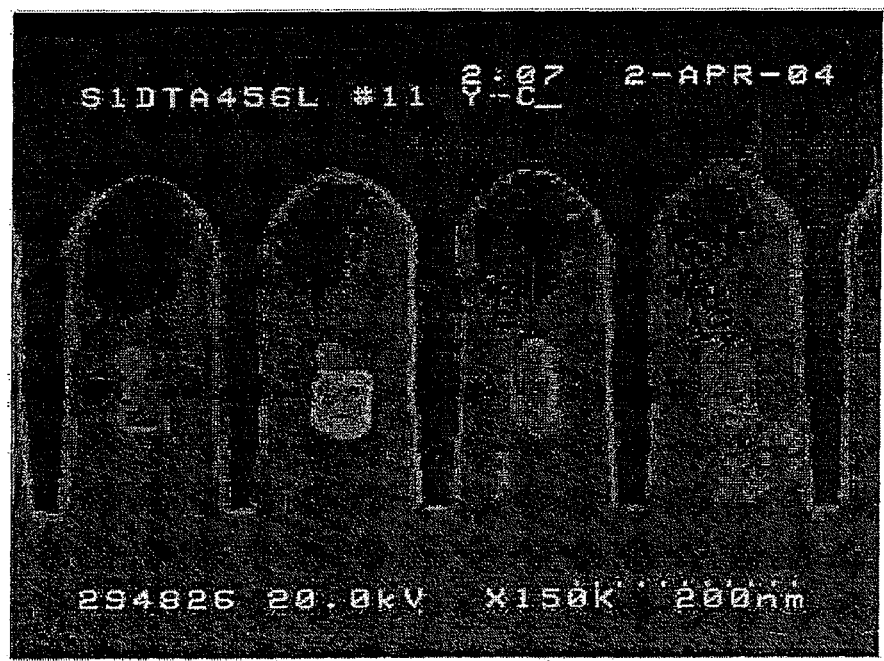
FIGS. 9A and 9B are SEM pictures illustrating dry etch characteristics of a silicon germanium layer with respect to a silicon oxide layer.

Referring to FIG. 9A, the silicon nitride layer is etched just with a thickness of about 30 Å while the silicon germanium layer is etched with a thickness of about 6000 Å. Thus, it is judged that the silicon nitride layer is hardly etched. From the data, an etch selectivity of the silicon germanium layer relative to the silicon nitride layer is about 200, and the etch selectivity is excellent.

Figure 9B:

FIG. 9B shows an SEM image when silicon oxide of an interlayer insulating layer is formed with a thickness of about 4000 Å, and it is dry-etched to form contact holes by a conventional technology. In this case, the silicon nitride layer is damaged with a thickness of about 300 Å, and an etch selectivity is about 12. Comparing FIGS. 9A and 9B, damage to the silicon nitride layer is significantly smaller around the shoulder of the gate electrode structure when using the silicon germanium layer.

As described above, according to the present invention, a fine pattern can be formed using conventional photoresist continuously, by employing a silicon germanium sacrificial layer, even though an aspect ratio of a pattern is increased with the decrease in the requirement for fabricating semiconductor devices. Therefore, a fine pattern of a semiconductor device such as a contact can be formed by an easier and more economical method. Particularly, such a process prevents deformation of a photoresist layer during a dry etching process, and prevents wiggling or striation. Furthermore, since photoresist for short wave length light source such as ArF photoresist, a lower thickness than that of KrF photoresist can be used, and the present invention can allow formation of finer patterns, and is also advantageous for high integration.

Particularly, the methods of the present invention can be more effectively employed on a self-aligned contact formation method since a hard mask layer and a spacer are slightly etched by a sputtering effect. In this case, using polysilicon or silicon nitride layer as an etch mask prevents process complication and increase of high operational costs. Further, electric characteristics of a device may improve since a sidewall spacer is composed of silicon oxide having a lower dielectric constant than that of silicon nitride.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a self-aligned contact of a semiconductor device comprising:

forming a conductive line structure which comprises a conductive material layer, a hard mask layer, and a sidewall spacer on a substrate;

forming a silicon germanium ($Si_{1-x}Ge_x$) sacrificial layer, which has a height equal to or higher than a height of at least the conductive line structure, on an entire surface of the substrate;

forming a photoresist pattern for defining a contact hole on the sacrificial layer;

dry-etching the sacrificial layer using the photoresist pattern as an etch mask, thereby forming the contact hole for exposing the substrate;

forming a plurality of contacts for filling the contact hole with polysilicon;

removing the remaining sacrificial layer by wet-etching; and filling the region where the removed sacrificial layer is located with silicon oxide, thereby forming a first interlayer insulating layer, wherein, x is from about 0.1 to about 0.8.

2. The method of claim 1, wherein the operation of forming the silicon germanium sacrificial layer comprises:

forming a silicon germanium layer on the entire surface of the substrate having the conductive line structure formed thereon; and performing a partial CMP on the silicon germanium sacrificial layer with a height higher than the conductive line structure.

3. The method of claim 1, wherein the conductive line structure is a gate line structure, which further includes a gate oxide layer formed under the conductive material layer.

4. The method of claim 3, which further comprises electrically connecting the contact to source/drain regions of the substrate.

5. The method of claim 1, wherein the hard mask layer comprises silicon nitride and the sidewall spacer comprises silicon nitride or silicon oxide.

6. The method of claim 1, wherein the conductive line structure is a bit line structure.

7. The method of claim 1, wherein the operation of dry etching employs a bias power of from about 30 to about 300 W in a dry etching chamber during the dry etching process of the sacrificial layer.

8. The method of claim 1, further comprising, after dry-etching the sacrificial layer, cleaning the resultant structure by HF.

9. The method of claim 1, wherein the wet etching process uses wet etchant, in which etch selectivity of the sacrificial layer pattern relative to the polysilicon is equal to or higher than about 30:1.

10. The method of claim 1, wherein the wet etching process uses wet etchant, in which an etch rate is about several hundred Å per minute.

11. The method of claim 1, wherein the process for removing the remaining sacrificial layer by wet etching uses wet etchant of a mixture including ammonium hydroxide ($NH_4OH$), hydrogen peroxide ($H_2O_2$), and deionized water ($H_2O$).

* * * * *